US010287682B2

(12) United States Patent
Kikuchi et al.

(10) Patent No.: US 10,287,682 B2
(45) Date of Patent: May 14, 2019

(54) SUBSTRATE PROCESSING APPARATUS, GAS SUPPLY METHOD, SUBSTRATE PROCESSING METHOD, AND FILM FORMING METHOD

(71) Applicant: TOKYO ELECTRON LIMITED, Tokyo (JP)

(72) Inventors: Kazuyuki Kikuchi, Iwate (JP); Tsuneyuki Okabe, Iwate (JP); Kohei Fukushima, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/468,563

(22) Filed: Mar. 24, 2017

(65) Prior Publication Data

US 2017/0275757 A1  Sep. 28, 2017

(30) Foreign Application Priority Data

Mar. 28, 2016 (JP) ................................ 2016-063723

(51) Int. Cl.
*C23C 16/455* (2006.01)
(52) U.S. Cl.
CPC .. *C23C 16/45561* (2013.01); *C23C 16/45546* (2013.01); *C23C 16/45557* (2013.01)
(58) Field of Classification Search
CPC .............................................. C23C 16/45561
See application file for complete search history.

(56) References Cited

U.S. PATENT DOCUMENTS

| 2008/0102021 A1* | 5/2008 | Oka | ........................... B01J 7/00 423/500 |
| 2014/0213069 A1* | 7/2014 | Takebayashi | ..... H01L 21/67109 438/770 |

FOREIGN PATENT DOCUMENTS

JP  2013-229001 A  11/2013
JP  2015-191957 A  11/2015

* cited by examiner

*Primary Examiner* — Joseph A Miller, Jr.
(74) *Attorney, Agent, or Firm* — Nath, Goldberg & Meyer; Jerald L. Meyer

(57) ABSTRACT

A substrate processing apparatus includes: a process container configured to receive a substrate therein; a pressure detection part configured to measure an internal pressure of the process container; an exhaust-side valve installed in an exhaust pipe configured to exhaust an interior of the process container; a gas storage tank connected to the process container through a first gas supply pipe; a gas amount measuring part configured to measure an amount of gas stored in the gas storage tank; and a control valve installed in the first gas supply pipe and configured to control the internal pressure of the process container by changing an opening degree of the control valve based on the internal pressure of the process container which is detected by the pressure detection part and by controlling a flow path cross section through which the gas is supplied from the gas storage tank to the process container.

10 Claims, 9 Drawing Sheets

SUBSTRATE PROCESSING APPARATUS, GAS SUPPLY METHOD, SUBSTRATE PROCESSING METHOD, AND FILM FORMING METHOD

CROSS-REFERENCE TO RELATED APPLICATION

This application claims the benefit of Japanese Patent Application No. 2016-063723, filed on Mar. 28, 2016, in the Japan Patent Office, the disclosure of which is incorporated herein in its entirety by reference.

TECHNICAL FIELD

The present disclosure relates to a substrate processing apparatus, a gas supply method, a substrate processing method, and a film forming method.

BACKGROUND

In the related art, a fluid control system is known which includes a vacuum chamber, a gas supply source for supplying a gas to the vacuum chamber, a gas supply pipe installed to connect the vacuum chamber and the gas supply source, a pressure sensor for detecting an internal pressure of the vacuum chamber, a pressure controller for controlling a proportional valve installed in the gas supply pipe based on an output provided from the pressure sensor; a flowmeter installed in the gas supply pipe, and a flow rate controller for controlling a throttle valve installed in an exhaust pipe based on an output provided from the flowmeter. In such a fluid control system, the pressure controller and the flow rate controller are installed independently of each other. The internal pressure of the vacuum chamber is controlled by the pressure controller. A flow rate of a process gas flowing to the vacuum chamber is controlled by the flow rate controller through the use of the throttle valve installed in the exhaust pipe.

Furthermore, a film forming apparatus has been used which forms a thin film on a substrate within a reaction chamber by alternately supplying a raw material gas and a reaction gas which reacts with the raw material gas to generate a reaction product, to the reaction chamber under vacuum atmosphere. The film forming apparatus includes: a raw material gas supply path through which the raw material gas is supplied into the reaction chamber; a tank installed in the middle of the raw material gas supply path and that stores the raw material gas with an increased pressure; and a flow rate regulating valve installed in the raw material gas supply path at the downstream side of the tank. The film forming apparatus is configured to supply a large amount of the raw material gas into the reaction chamber through the tank in a short period of time. The flow rate regulating valve installed in the raw material gas supply path at the downstream side of the tank is a valve capable of regulating a set flow rate thereof. However, the flow rate regulating valve performs only opening and closing operations and does not control an opening degree thereof in real time.

However, in the conventional fluid control system, a pressure and a flow rate are controlled independently of each other. Such pressure and flow rate are correlated with each other and influence each other. As such, clogging is more likely to occur while the pressure and the flow rate are being independently controlled. Furthermore, the conventional fluid control system requires both the pressure controller and the flow rate controller, which results in an increase in size of the system and an increase in cost.

The conventional film forming apparatus is effective in supplying a large amount of raw material gas into the reaction chamber in a short period of time. However, since the flow rate of the raw material gas supplied into the reaction chamber from the tank is not feedback-controlled, the conventional film forming apparatus may be not sufficient to meet the requirement of supplying a large amount of raw material gas in a short period of time while controlling the flow rate in real time.

SUMMARY

Some embodiments of the present disclosure provide a substrate processing apparatus, a gas supply method, a substrate processing method, and a film forming method, which are capable of supplying a large amount of gas in a short period of time while controlling a flow rate of the gas through a pressure control.

According to one embodiment of the present disclosure, there is provided a substrate processing apparatus including: a process container configured to receive a substrate therein; a pressure detection part configured to measure an internal pressure of the process container; an exhaust-side valve installed in an exhaust pipe configured to exhaust an interior of the process container; a gas storage tank connected to the process container through a first gas supply pipe; a gas amount measuring part configured to measure an amount of gas stored in the gas storage tank; and a control valve installed in the first gas supply pipe and configured to control the internal pressure of the process container by changing an opening degree of the control valve based on the internal pressure of the process container which is detected by the pressure detection part and by controlling a flow path cross section through which the gas is supplied from the gas storage tank to the process container.

According to another embodiment of the present disclosure, there is provided a gas supply method which includes: storing a gas in a gas storage tank connected to a container through a first gas supply pipe; detecting that an amount of the gas stored in the gas storage tank has reached a predetermined amount; making a conductance of an exhaust pipe connected to the container constant; detecting an internal pressure of the container; and controlling, by a control valve installed in the first gas supply pipe, the internal pressure of the container to be a predetermined pressure by changing an opening degree of the control valve based on the detected internal pressure of the container and changing a flow path cross section through which the gas is supplied from the gas storage tank to the container.

According to yet another embodiment of the present disclosure, there is provided a substrate processing method which includes carrying a substrate into a process container, and supplying a process gas for processing the substrate to the process container, using the aforementioned gas supply method.

According to still another embodiment of the present disclosure, there is provided a film forming method which includes: carrying a substrate into a process container; supplying a raw material gas for film formation to the process container, using the aforementioned gas supply method; supplying, to the process container, a reaction gas which reacts with the raw material gas to produce a reaction product; and supplying, to the process container, a purge gas that purges the raw material gas and the reaction gas.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4A illustrates a procedure of storing a gas in the gas storage tank, FIG. 4B illustrates a procedure of ending the storage of the gas in the gas storage tank and preparing the supply of the gas to the process container, and FIG. 4C illustrates a procedure of controlling pressure using a control valve while supplying the gas from a gas storage tank to the process container.

FIG. 5A illustrates the pressure controllability for a time interval of 60 seconds, and FIG. 5B is an enlarged view illustrating the pressure controllability for a time interval of 5 seconds.

FIG. 6A illustrates the pressure controllability for a time interval of 60 seconds, and FIG. 6B is an enlarged view illustrating the pressure controllability for a time interval of 5 seconds.

FIG. 7A illustrates the pressure controllability for a time interval of 60 seconds, and FIG. 7B is an enlarged view illustrating the pressure controllability for a time interval of 5 seconds.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
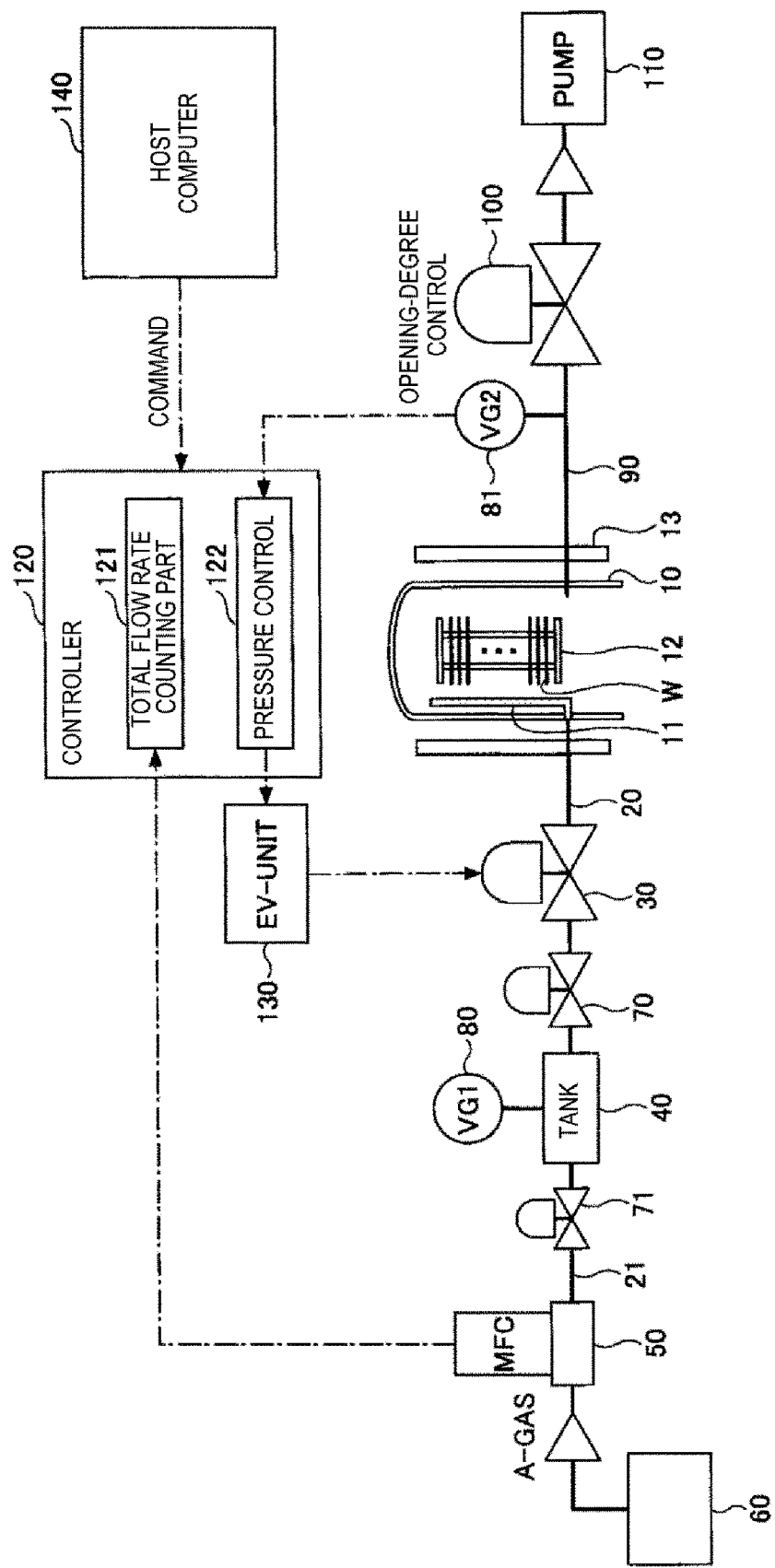
FIG. 1 illustrates an example of a substrate processing apparatus according to an embodiment of the present disclosure.

FIG. 1 illustrates an example of a substrate processing apparatus according to an embodiment of the present disclosure. As illustrated in FIG. 1, the substrate processing apparatus according to an embodiment of the present disclosure includes a process container 10, gas supply pipes 20 and 21, a control valve 30, a gas storage tank 40, a mass flow controller 50, a gas supply source 60, shut-off valves 70 and 71, pressure sensors 80 and 81, an exhaust pipe 90, an exhaust-side valve 100, a vacuum pump 110, a controller 120, an electro-pneumatic regulator 130, and a host computer 140. The process container 10 includes an injector 11 installed therein, and a wafer boat 12 and wafers W which are carried into the process container 10 when a substrate process is performed. A heater 13 is disposed outside of the process container 10. The controller 120 includes a total flow rate counting part 121 and a pressure control part 122.

The process container 10 is a vessel configured to perform the substrate process with respect to substrates such as wafers W received therein. The substrate process includes various processes such as a film forming process, an etching process, a cleaning process and the like, which supply gases into the process container 10 to process the substrates. The film forming process may include various film forming methods, such as Chemical Vapor Deposition (CVD), Atomic Layer Deposition (ALD) or the like, which can be applied for any film formation. However, this embodiment will be described with an example where the present disclosure is applied to a vertical heat-treatment apparatus in which a plurality of wafers W is held by the wafer boat 12 configured to hold the wafers W at a predetermined vertical interval, a raw material gas for film formation and a reaction gas reacting with the raw material gas to generate a reaction product are supplied to the wafers W, and the process container 10 is heated to perform the film formation. The injector 11 is a gas supply part configured to supply a process gas into the process container 10 and configured as a vertically-extending quartz tube. The heater 13 performs a heat treatment (a film forming process) by applying heat to the wafers W from the outside of the process container 10. A process gas supply part such as the process container 10, the injector 11 and the like, and a substrate holding part such as the wafer boat 12, may be widely configured depending on the intended use or the purpose of the substrate processing apparatus. However, this embodiment will be described with an example where film forming process is performed using the vertical heat-treatment apparatus.

The wafer boat 12 having the plurality of wafers W held therein is carried into the process container 10 where the substrate process is carried out. After the substrate process, the wafer boat 12 is carried out of the process container 10 to take out the processed wafers W. While a transfer mechanism is omitted in FIG. 1, various transfer mechanisms capable of carrying the wafer boat 12 into and out of the process container 10 may be used.

An example of using an ALD method as a film forming method will be described. The ALD method is a film forming method which repeats a cycle to gradually deposit atomic layers (more precisely, molecular layers) of a reaction product, which is generated by a reaction of a raw material gas with a reaction gas, on a wafer W. The cycle includes supplying the raw material gas of Si or the like into the process container 10 from the injector 11 for a predetermined period of time, followed by supplying a purge gas such as nitrogen into the process container 10 from another injector 11 for a predetermined period of time, followed by supplying a reaction gas (such as an oxidizing gas, a nitriding gas or the like) which reacts with the raw material gas for a predetermined period of time, and followed by supplying a purge gas for a predetermined period of time. In this case, the supply of the raw material gas, the purge gas, the reaction gas and the purge gas into the process container 10 is required to be performed in a sequential manner without supplying all kinds of gases at one time. This requires supplying each gas at a high flow rate in a short period of time. The condition called the short period of time is necessary to increase productivity of the film forming process since different kinds of gases are required to be sequentially supplied in the cycle as described above. Further, the condition called the high flow rate is necessary to sufficiently supply the process gases to all wafers W since the plurality of (for example, 50 to 100) wafers W is simultaneously processed in a batch manner. Particularly, it is difficult for, among the process gases, the raw material gas containing silicon, metal or the like, to supply at a high flow rate in a short period of time, compared to an oxidizing gas (for example, $O_2$, $O_3$, or $H_2O$) or a nitriding gas (for example, $NH_3$).

The substrate processing apparatus according to this embodiment can supply a gas containing a raw material gas into the process container 10 at a high flow rate in a short period of time while controlling a flow rate thereof. Thus, the present disclosure is considerably effective for a film formation using the above-described ALD method.

The gas supply pipes 20 and 21 are connected to the upstream side of the process container 10. The exhaust pipe 90 is connected to the downstream side of the process container 10.

The gas supply pipes 20 and 21 are pipes configured to supply a gas into the process container 10. The gas supply pipe 20 is connected to the injector 11 installed inside the process container 10 to supply the gas to the injector 11. The gas supply pipe 20 is connected between the process container 10 and the gas storage tank 40. The control valve 30 and the shut-off valve 70 are installed in the gas supply pipe 20.

The gas supply pipe 21 is installed at the upstream side of the gas storage tank 40. The upstream side of the gas supply pipe 21 is connected to the gas supply source 60. The gas supply source 60 is a supply source configured to supply the gas to the gas storage tank 40 and the process container 10. For example, the gas supply source 60 may be a tank with which the gas is filled or a connection port to which the gas is supplied.

For example, the mass flow controller 50 and the shut-off valve 71 are installed between the gas supply source 60 and the gas storage tank 40.

The mass flow controller 50 measures a mass flow rate of a gas flowing from the gas supply source 60 to the gas storage tank 40 to control a flow rate of the gas. It is necessary to measure the total amount of gas stored in the gas storage tank 40. Thus, in this embodiment, the mass flow controller 50 may measure not only an instantaneous flow rate but also the total flow rate of the gas supplied to the gas storage tank 40. The mass flow controller 50 may be used as long as it has such measurement functions. Alternatively, in a case where the mass flow controller 50 itself can measure only the instantaneous flow rate, the mass flow controller 50 may be configured to transmit a flow rate information to the total flow rate counting part 121 of the controller 120 such that the total flow rate counting part 121 measures and identifies the total flow rate. In this case, the combination of the mass flow controller 50 and the total flow rate counting part 121 of the controller 120 serves as an integrating flowmeter.

In this embodiment, it is only necessary to identify whether the amount of gas stored in the gas storage tank 40 reaches a predetermined amount. Thus, instead of the mass flow controller 50, other devices may be used as long as they can perform such measurement and calculation operations.

The shut-off valve 71 is a valve configured to determine whether to open or close the gas supply pipe 21 connected between the gas supply source 60 and the gas storage tank 40 according to whether or not the supply of gas from the gas supply source 60 to the gas storage tank 40 is required. The shut-off valve 71 may be installed as needed.

The gas storage tank 40 is to store a gas and may be a buffer tank configured to supply a large amount of gas into the process container 10 in a short period of time. In order words, existing flow rate controllers are not adapted for the case of using a film forming method such as ALD which continuously switches the supply of various kinds of gases. Thus, a structure capable of supplying a large amount of gas in a short period of time is required. The gas storage tank 40 temporarily stores a large amount of gas and supplies the same into the process container 10 at the same time in a short period of time, which makes it possible to supply the large amount of gas in a shorter time. The volume of the gas storage tank 40 may be set to an appropriate value depending on the intended use. For example, the gas storage tank 40 may have the volume of about 1 to 3 liters.

The pressure sensor 80 is a pressure detection part configured to monitor the internal pressure of the gas storage tank 40. The pressure sensor 80 may be a sensor configured to detect whether the internal pressure of the gas storage tank 40 reaches a predetermined pressure, or may be a measurement sensor capable of measuring the internal pressure of the gas storage tank 40. A set pressure of the gas storage tank 40 may be set to an appropriate value depending on the volume, the intended use and the like of the process container 10. For example, the set pressure may fall within a range of about 50 to 600 Torr. As an example, in a case where the gas storage tank 40 has a volume of 1.5 liters, the set pressure may be 100 Torr (13 kPa). The internal pressure of the gas storage tank 40 may be obtained based on the already known volume of the gas storage tank 40 and the amount of gas stored therein, which makes it possible to manage the internal pressure of the gas storage tank 40. In this embodiment, the control of the internal pressure of the gas storage tank 40 is carried out based on the identified gas amount. Thus, the pressure sensor 80 may be installed as needed and is not essential.

The control valve 30 is a valve capable of controlling an area (flow path cross section) of the gas supply pipe 20 through which the gas passes, and changing an opening degree thereof. When the gas is supplied from the gas storage tank 40 to the process container 10, the opening degree of the control valve 30 is controlled to change the flow path cross section of the gas supply pipe 20 through which the gas can pass, which makes it possible to vary the flow rate of the gas. However, in this embodiment, the flow rate of the gas is controlled to become constant rather than be changed. To perform such a control requires controlling the internal pressure of the process container 10 to a predetermined constant pressure, namely a target pressure. By changing the opening degree of the control valve 30 to make the internal pressure of the process container 10 constant, it is possible to make the flow rate of the gas supplied from the gas storage tank 40 to the process container 10 through the gas supply pipe 20 constant. A detailed description of such a principle will be given below.

As the control valve 30, various kinds of valves may be used as long as they can be feedback-controlled based on a pressure detected by the pressure sensor 81 such that the internal pressure of the process container 10 is kept constant.

The electro-pneumatic regulator 130 is a drive part configured to drive the control valve 30 and to control the opening degree of the control valve 30 with a pneumatic pressure based on an electrical signal. For example, the electro-pneumatic regulator 130 may non-stepwisely (continuously) change the pneumatic pressure in proportion to the electrical signal, thus smoothly controlling the opening degree of the control valve 30 driven by the pneumatic pressure.

The shut-off valve 70 is installed in the gas supply pipe 20 between the control valve 30 and the gas storage tank 40 and is closed to shut off the gas supply pipes 20 and 21 when a gas is being stored in the gas storage tank 40. The shut-off valve 70 is opened when the gas is supplied from the gas storage tank 40 to the process container 10. Such an operation may be implemented by closing the control valve 30 when a gas is being stored in the gas storage tank 40. Further, the opening degree of the shut-off valve 70 may be controlled by opening the control valve 30 when the gas is supplied from the gas storage tank 40 to the process container 10. Thus, the shut-off valve 70 may be installed as needed and is not essential. In some embodiments, in a case where one does not wish to change the opening degree of the control valve 30 too much, the control valve 30 may be mainly controlled such that the opening degree of the control valve 30 is set to be close to the opening degree available when a gas is supplied from the gas storage tank 40 to the process container 10. In this case, the supply of gas in the gas storage tank 40 and the start of the supply of the gas from the gas storage tank 40 to the process container 10 may be implemented by opening and closing the shut-off valve 70. For example, in order to implement such valve operation, the shut-off valve 70 may be installed.

The pressure sensor 81 detects and measures the internal pressure of the process container 10. The internal pressure of the process container 10 is identical to an internal pressure of the exhaust pipe 90 installed between the process container 10 and the exhaust-side valve 100. Thus, by measuring the internal pressure of the exhaust pipe 90 between the process container 10 and the exhaust-side valve 100, it is possible to measure the internal pressure of the process container 10. The pressure sensor 81 may be installed inside the process container 10 as long as it can detect the internal pressure of the process container 10. In some embodiments, the pressure sensor 81 may be installed anywhere in the exhaust pipe 90 at the upstream side of the exhaust-side valve 100. In this embodiment, an example in which the pressure sensor 81 is installed in the exhaust pipe 90 is described. Various pressure detection parts may be used as the pressure sensor 81 depending on the intended use as long as they can accurately measure the internal pressure of the exhaust pipe 90, namely the internal pressure of the process container 10.

The vacuum pump 110 is to vacuum-exhaust the interior of the process container 10 through the exhaust pipe 90. Various exhaust parts may be used as the vacuum pump 110 as long as they can exhaust the interior of the process container 10 up to a vacuum level required for a substrate process.

The exhaust-side valve 100 is a valve configured to regulate an exhaust amount of the exhaust pipe 90. The exhaust-side valve 100 is set to have a constant opening degree when a gas is supplied from the gas storage tank 40 to the process container 10. Thus, the exhaust-side valve 100 serves to set the conductance of the exhaust pipe 90 constant. As described above, when a gas is supplied from the gas storage tank 40 to the process container 10, the internal pressure of the process container 10 is controlled to have a constant level. For this reason, if the conductance of the exhaust pipe 90 varies, it is difficult to carry out such a control. Accordingly, when a gas is supplied from the gas storage tank 40 to the process container 10, the opening degree of the exhaust-side valve 100 is set to a predetermined opening degree of a constant level. The exhaust-side valve 100 is not particularly restricted. Various valves may be used as the exhaust-side valve 100. For example, an automatic pressure controller (APC) valve may be used as the exhaust-side valve 100. In some embodiments, the exhaust-side valve 100 may be manually operated, or may be configured to be controlled by the controller 120.

Based on the internal pressure of the process container 10 detected by the pressure sensor 81, The pressure control part 122 feedback-controls the opening degree of the control valve 30 and controls the internal pressure of the process container 10 to become a predetermined target pressure. Furthermore, as described above, the control valve 30 may be controlled by the electro-pneumatic regulator 130.

The feedback control performed by the pressure control part 122 may be, for example, a proportional integral differential (PID) control. By controlling an input value based on three factors including a difference between an output value and a target value, and integral and differential valves thereof, it is possible to finely and smoothly control the exhaust.

The controller 120 is a means for performing an operation process including the control, and includes a processor such as a central processing unit (CPU), and a storage part such as a read only memory (ROM), a random access memory (RAM) or the like. The controller 120 may be configured with a microcomputer that operates by executing programs, or may be configured with an integrated circuit such as an application specific integrated circuit (ASIC) into which a plurality of functional circuits is combined for a specific purpose.

A recipe in which specific contents of the substrate process are listed may be stored in a storage medium, and the controller 120 may download the contents to carry out the substrate process set forth in the recipe.

The controller 120 may control the entire operation of the substrate processing apparatus if necessary, in addition to the pressure control of the control valve 30 performed by the pressure control part 122 and the calculation of the amount of gas stored in the gas storage tank 40 performed by the total flow rate counting part 121. For example, if necessary, the controller 120 may control the operation of the shut-off valves 70 and 71, the operation of the process container 10, the operation of the exhaust-side valve 100, and the like.

The host computer 140 is a higher-level computer that issues an instruction to the controller 120 and is a computer that performs the control and management of the whole factory, including relationships between the substrate processing apparatus and other process apparatuses.

Next, the principle of a gas supply method performed by the substrate processing apparatus according to this embodiment will be described. Specifically, a principle will be described in which a gas is able to be supplied into the process container 10 at a constant flow rate by controlling the internal pressure of the process container 10 using the opening degree of the control valve 30 installed in the gas supply pipe 20 so as to maintain the internal pressure of the process container 10 at a predetermined target pressure.

Figure 2:
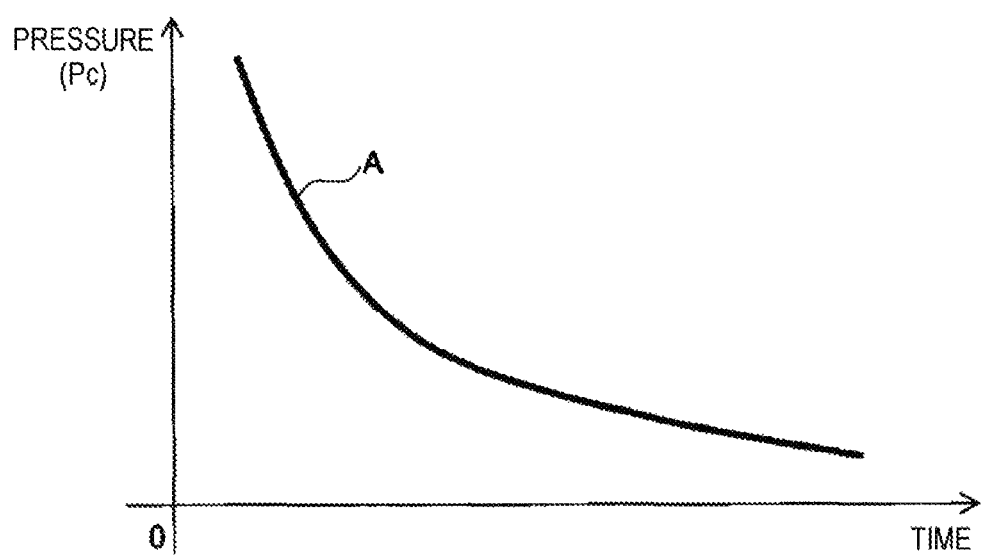
FIG. 2 is a graph for explaining a variation in internal pressure of a gas storage tank and a process container as a function of time.

FIG. 2 is a graph for explaining a variation in the internal pressures of the gas storage tank 40 and the process container 10 as a function of time.

A description applied to a gas state equation will be given below. The gas storage tank 40 will be referred to as a buffer tank 40 for short, and the process container 10 will be simply referred to as a chamber 10.

First, assuming that the pressure of the buffer tank 40 is indicated by Pb, the volume of the buffer tank 40 is indicated by Vb, the internal pressure of the chamber 10 is indicated by Pc, and the volume of the chamber 10 is indicated by Vc, the following equation (1) below is established since n, R, and T in the gas state equation PV=nRT are the same.

$$Pb \times Vb = Pc \times Vc \quad (1)$$

Herein, since the pressure gauge 80 is installed, Vb is known, and the integrating flowmeter manages a flow rate at a constant level, Pb (the pressure of the buffer tank 40) is under management. In addition, even though the pressure gauge 80 is not installed, since Vb is known and the flow rate is also known, Pb is under management.

Vb (the volume of the buffer tank 40) is constant since the buffer tank 40 is a mechanical product, the volume of the buffer tank 40 is constant.

Pc (the internal pressure of the chamber 10) is a target to be controlled in this embodiment.

Vc (the volume of the chamber 10) is considered constant since the chamber 10 is constantly vacuumed by the vacuum pump 110.

Equation (2) below is established from Equation (1).

$$Pb\text{(constantly controlled)} \times Vb\text{(constant)} = Pc\text{(constantly controlled)} \times Vc\text{(constant)} \quad (2)$$

Where, Pb×Vb is equal to the amount of gas (the total amount of molecules) within the buffer tank 40, that is to say, the amount of gas stored in the buffer tank 40.

Since Vc is constant, the amount of gas supplied from the buffer tank 40 to the chamber 10 is inversely proportional to Pc (the internal pressure of the chamber 10).

For example, the amount of gas (Pb×Vb) accumulated in the buffer tank 40 is assumed to be 1,000 sccm. Since Vb is constant, Pb is proportional to the amount of the gas.

It is assumed that the gas has been completely used for 10 seconds with Pc controlled to be 3 Torr. Then, the relationship of 1,000 sccm (the amount of gas)=3 Torr (pressure)×10 sec (time)×gas flow rate α (=the amount of gas/pressure× time) is established.

Here, elapsed time (sec)=1,000 sccm/(Pc×gas flow rate α) is established so that the elapsed time is inversely proportional to Pc.

In other words, if Pc is controlled to be 1.5 Torr, which is a half of 3 Torr, the gas is completely used for 20 seconds, and if Pc is controlled to be 1.0 Torr, which is one-third of 3 Torr, the gas is completely used for 30 seconds.

This relationship is illustrated in FIG. 2. That is to say, time on the horizontal axis and pressure Pc are inversely proportional to each other.

Figure 3:
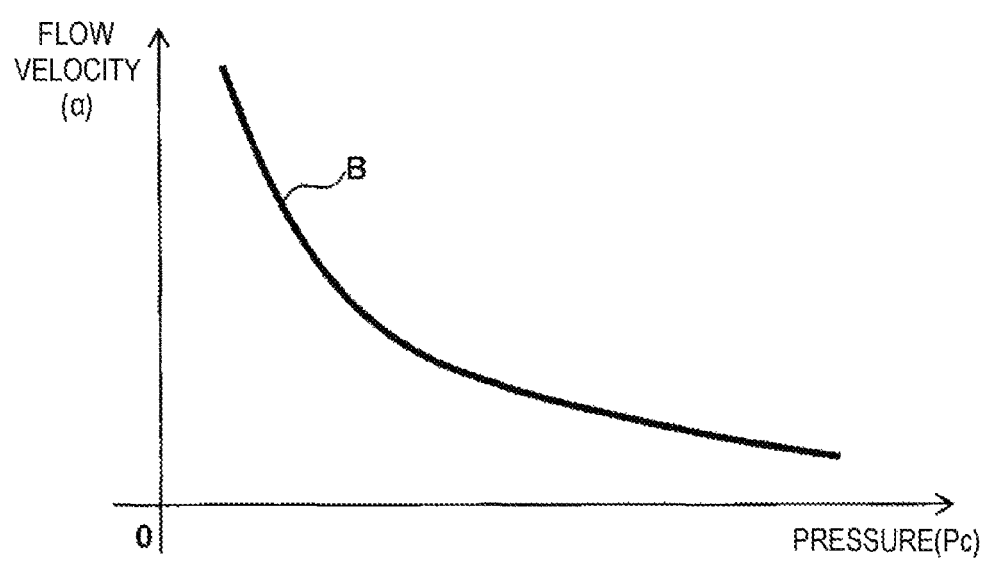
FIG. 3 is a graph depicting a relationship between pressure and flow velocity.

FIG. 3 is a graph depicting a relationship between the pressure and the flow velocity.

As described thus far, the relationship of the gas flow velocity α=the amount of gas/(elapsed time×Pc) is established. Accordingly, when the amount of gas and the elapsed time are constant, the gas flow velocity α is inversely proportional to Pc.

FIG. 3 illustrates this relationship. That is to say, the pressure Pc on the horizontal axis is inversely proportional to the flow velocity α on the vertical axis.

Where, the flow velocity α is similar in concept to a flow rate, and thus, these represent a traveling degree of gas per unit time. That is to say, since the flow velocity α represents a travel distance of gas per unit time, and the flow rate represents a travel volume per unit time, the flow velocity α and the flow rate may be used synonymously.

Accordingly, providing that the amount of gas within the buffer tank 40 and the time consumed to completely use the gas are constant, the pressure Pc and the gas flow velocity α are proportional to each other. Thus, the pressure Pc and the flow rate are also proportional to each other. That is to say, providing that the internal pressure of the chamber 10 is constant, the flow rate is also constant. Accordingly, by constantly controlling the internal pressure of the process container 10, it is possible to make the flow rate of the gas supplied to the process container 10 constant.

The substrate processing apparatus and the gas supply method according to this embodiment uses the aforementioned principle so that the internal pressure of the process container 10 is kept at the predetermined constant pressure (target pressure), thus uniformly controlling the flow rate of the gas supplied from the gas storage tank 40 to the process container 10. That is to say, it is possible to supply a large amount of gas in a short period of time using the gas storage tank 40 while uniformly controlling the flow rate of the gas.

Figure 4A:
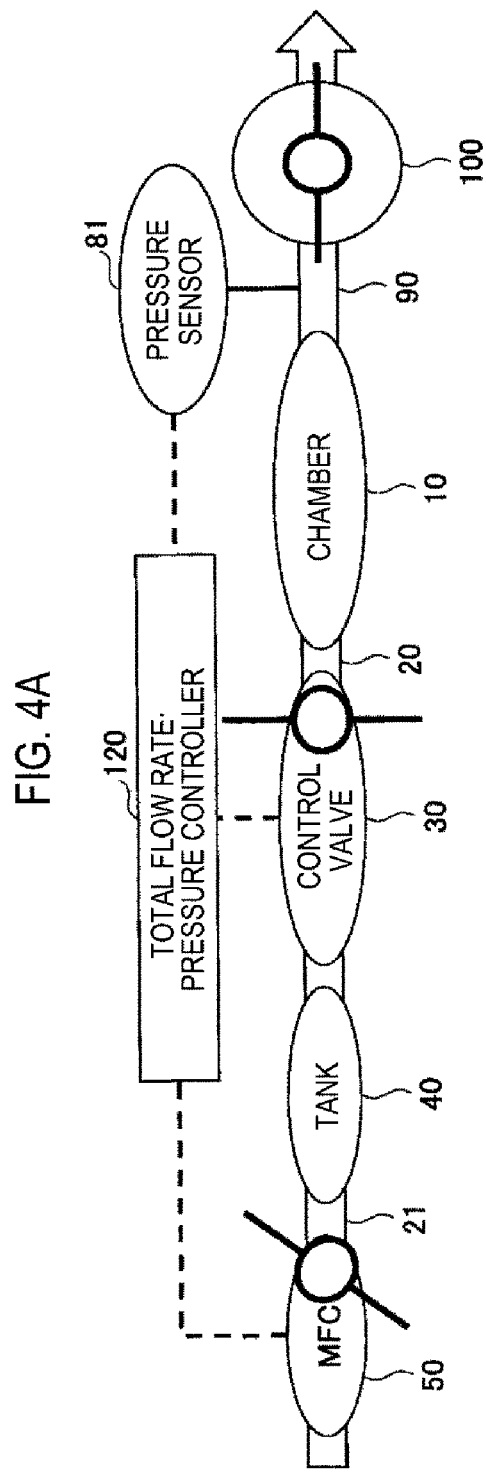
FIGS. 4A to 4C are views for explaining a gas supply method using the substrate processing apparatus according to an embodiment of the present disclosure, where
Figure 4B:
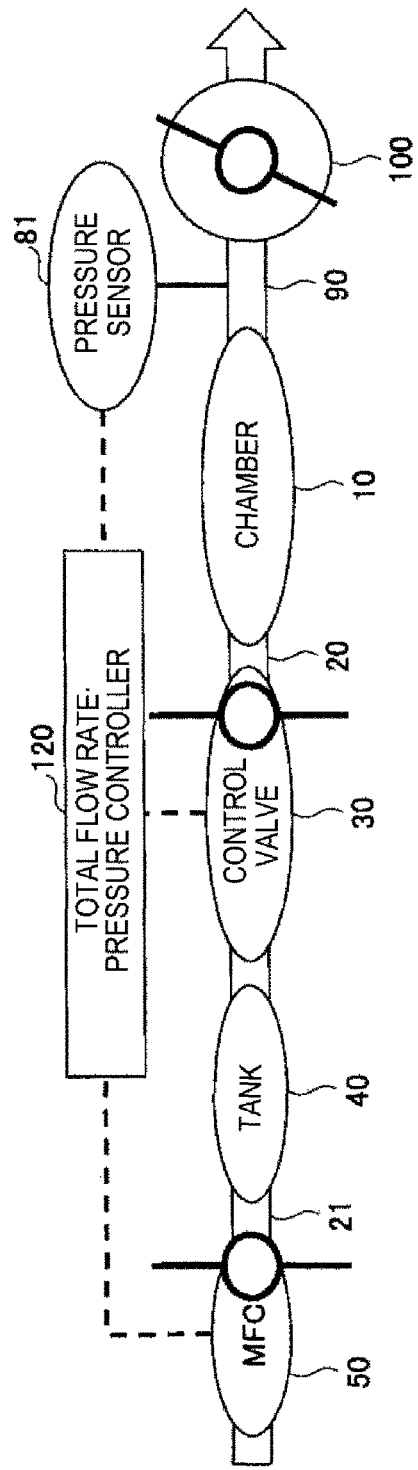
Figure 4C:
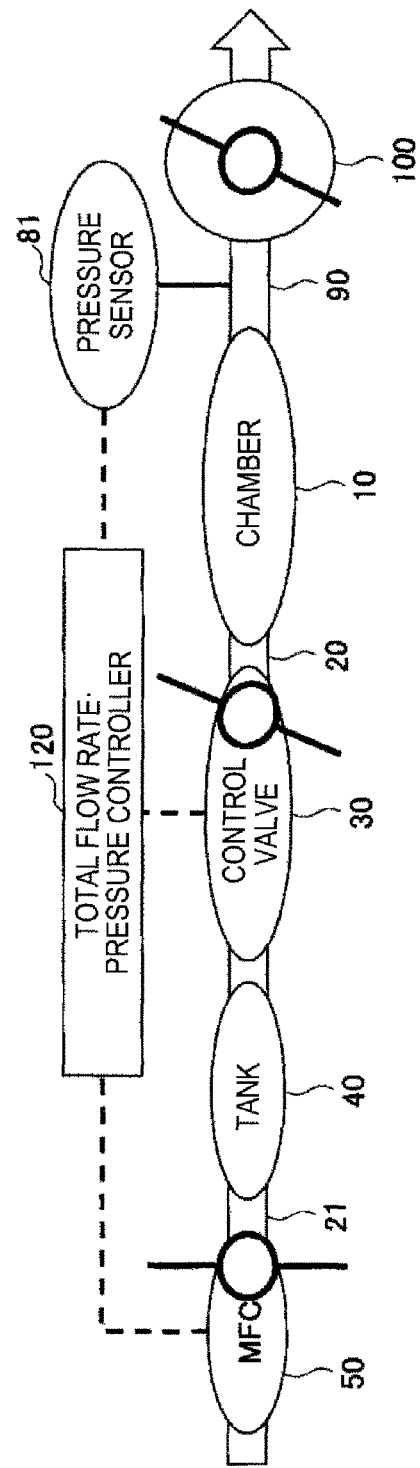

Accordingly, it is possible to uniformly supply a gas with a small variation even in the ALD-based film formation, thus enhancing an inter-plane uniformity between the plurality of wafers W and an in-plane uniformity in the wafer W FIGS. 4A to 4C are views for explaining a gas supply method using the substrate processing apparatus according to an embodiment of the present disclosure. In FIGS. 4A to 4C, for the sake of convenience in description, only major components of the substrate processing apparatus according to this embodiment are illustrated.

FIG. 4A illustrates a procedure of storing a gas in the gas storage tank 40. In the procedure of storing the gas in the gas storage tank 40, the mass flow controller 50 is opened to supply the gas to the gas storage tank 40 through the gas supply pipe 21. At this time, the mass flow controller 50 measures a flow rate of the gas, and the controller 120 measures (or calculates) the total flow rate of the gas. In this procedure, the control valve 30 remains closed. Furthermore, the interior of the process container 10 is vacuum-exhausted so that the process container 10 can perform a substrate process, and the exhaust-side valve 100 remains completely opened.

FIG. 4B illustrates a procedure of ending the storage of the gas in the gas storage tank 40 and preparing the supply of the gas to the process container. In this procedure, the mass flow controller 50 is closed since the gas storage tank 40 is filled with a predetermined amount or more of the gas. Meanwhile, the exhaust-side valve 100 is maintained at a predetermined fixed opening degree so as to make the conductance of the exhaust pipe 90 constant. The control valve 30 still remains closed since the supply of the gas to the process container 10 is not yet initiated.

FIG. 4C illustrates a procedure of controlling the internal pressure of the process container 10 using the control valve 30 while supplying the gas from the gas storage tank 40 to the process container 10. In this procedure, the control valve 30 remains opened, and the opening degree of the control valve 30 is controlled to maintain the internal pressure of the process container 10, which is detected by the pressure sensor 81, at a predetermined pressure, namely a predetermined target pressure. Accordingly, the gas within the gas storage tank 40 is constantly supplied into the process container 10 in large amounts in a short period of time. The opening degree of the exhaust-side valve 100 is fixed at the predetermined opening degree so as to maintain the constant conductance, and the mass flow controller 50 is kept in the closed state.

After supplying the gas for a predetermined period of time in the state of FIG. 4C, the substrate processing apparatus returns to the state of FIG. 4A to repeat the cycle of FIGS. 4A to 4C. In this manner, the gas is repeatedly supplied at a constant flow rate in a short period of time, which makes it possible to implement the gas supply method most suitable for the ALD-based film forming process.

The ALD-based film forming process includes supplying a raw material gas into the process container 10 in one cycle of FIGS. 4A to 4C, followed by sequentially supplying a purge gas, a reaction gas (such as an oxidizing gas, a nitriding gas or the like) and a purge gas into the process container 10, followed by supplying the raw material gas into the process container 10 again in a subsequent cycle. By performing the cycle in sequence, it is possible to deposit molecular layers on a film and to perform the film formation.

Next, a description will be made as to the pressure controllability in examples in which the gas supply method using the substrate processing apparatus according to this embodiment is implemented.

Figure 5A:
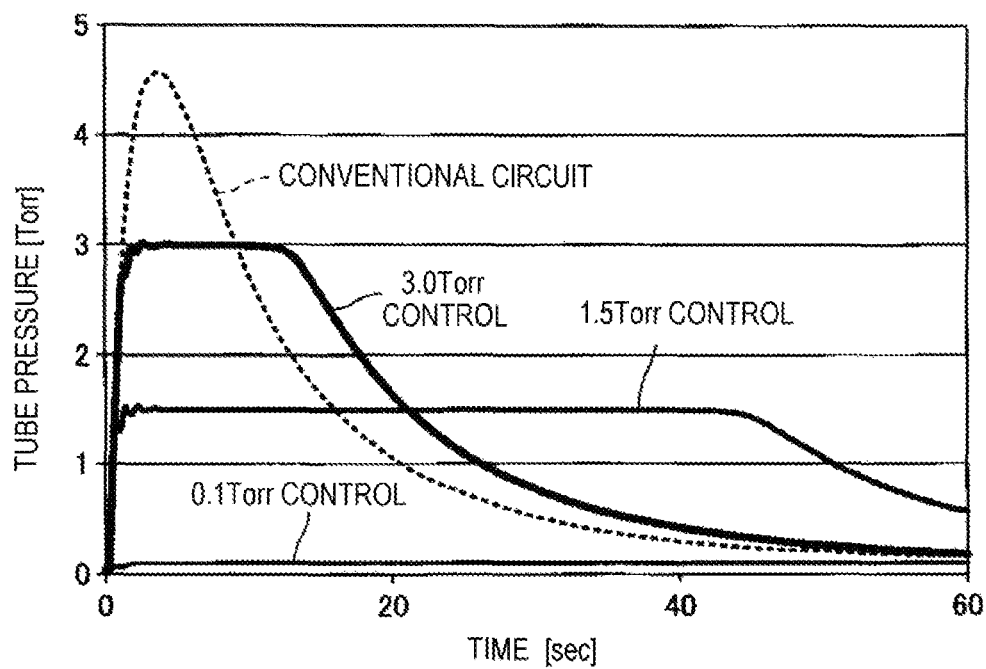
FIGS. 5A and 5B are graphs depicting a pressure controllability relating to Example 1 of the present disclosure, where
Figure 5B:
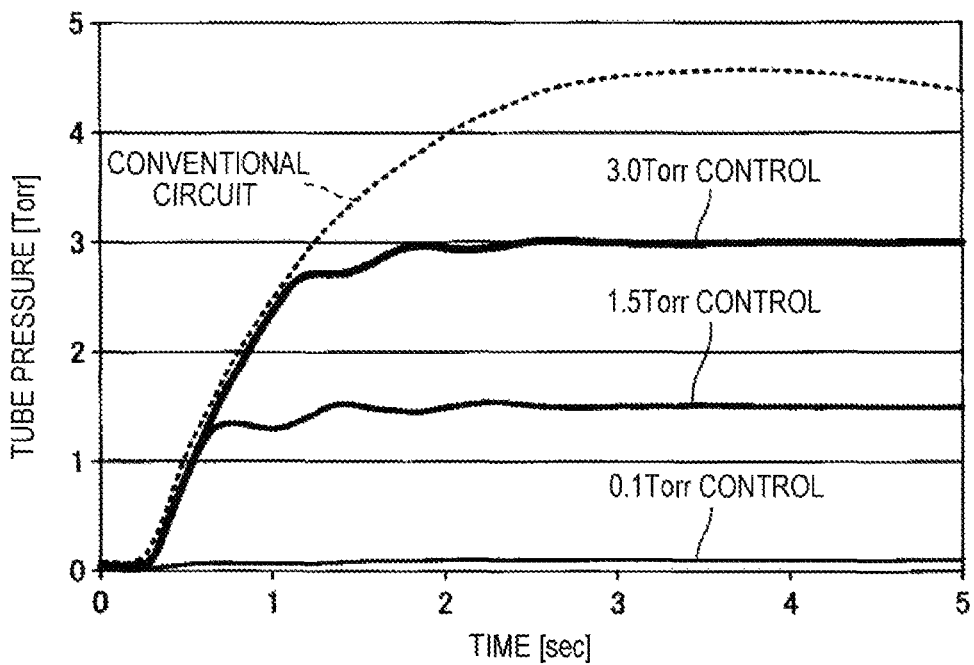

FIGS. 5A and 5B are graphs depicting the pressure controllability in relation to Example 1 of the present disclosure. In Example 1, a variation in the internal pressure of the process container 10 with time was measured by supplying a gas in a state where an internal charge pressure of the gas storage tank 40 is set to 600 Torr, and an internal target pressure of the process container 10 is set to 3.0 Torr, 1.5 Torr, and 0.1 Torr. FIG. 5A illustrates the pressure controllability for a time interval of 60 seconds, and FIG. 5B is an enlarged view illustrating the pressure controllability for a time interval of 5 seconds.

As illustrated in FIG. 5A, the substrate processing apparatus and the gas supply method in the related art exhibited a pressure characteristic in which the internal pressure of the process container 10 rapidly increased in an initial stage and then rapidly dropped. Thus, the flow rate also underwent the same variation.

Meanwhile, in the case where the internal pressure of the process container 10 was controlled to be a predetermined pressure of 3.0 Torr, the internal pressure of the process container 10 was uniformly maintained at 3.0 Torr for a little less than 20 seconds. During the time period, the flow rate of the gas supplied from the gas storage tank 40 to the process container 10 through the gas supply pipe 20 was also made constant, as described above with reference to FIGS. 2 and 3.

Likewise, in the case where the internal pressure of the process container 10 was controlled to be a predetermined pressure of 1.5 Torr, the flow rate of the gas was uniformly maintained for 40 seconds or more. Even in the case of 0.1 Torr, needless to say, the flow rate of the gas was uniformly maintained for a further prolonged period of time.

As illustrated in FIG. 5B, the same results are also illustrated in the enlarged view illustrating the pressure controllability for a time interval of 5 seconds. That is to say, it can be seen that the substrate processing apparatus and the gas supply method in the related art fail to make the flow rate constant but constantly controls the flow rate under the condition that the pressure is controlled to be constant.

Figure 6A:
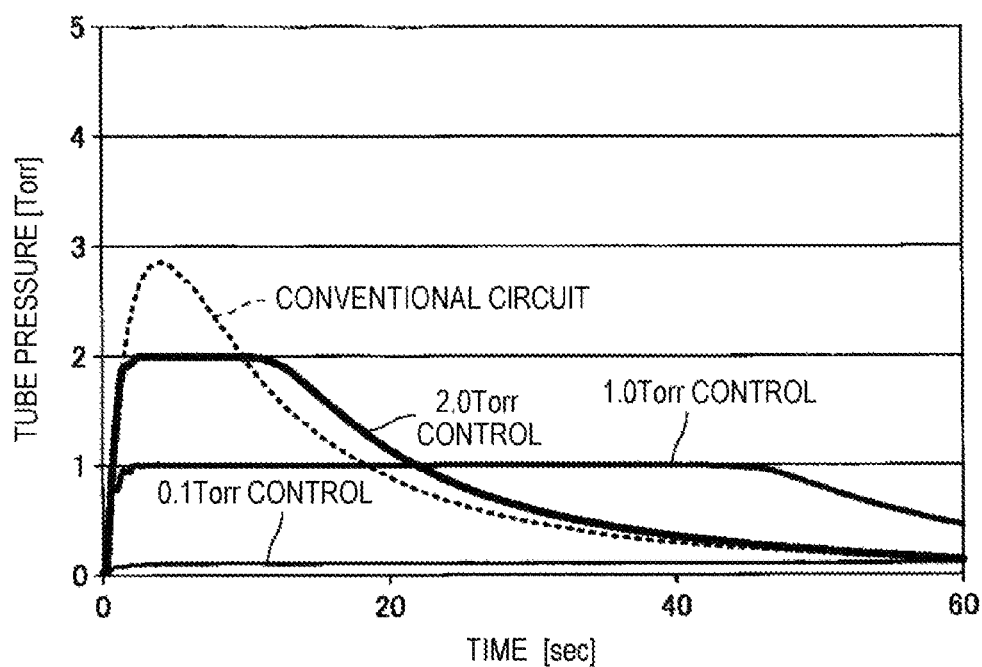
FIGS. 6A and 6B are graphs depicting a pressure controllability relating to Example 2 of the present disclosure, where
Figure 6B:
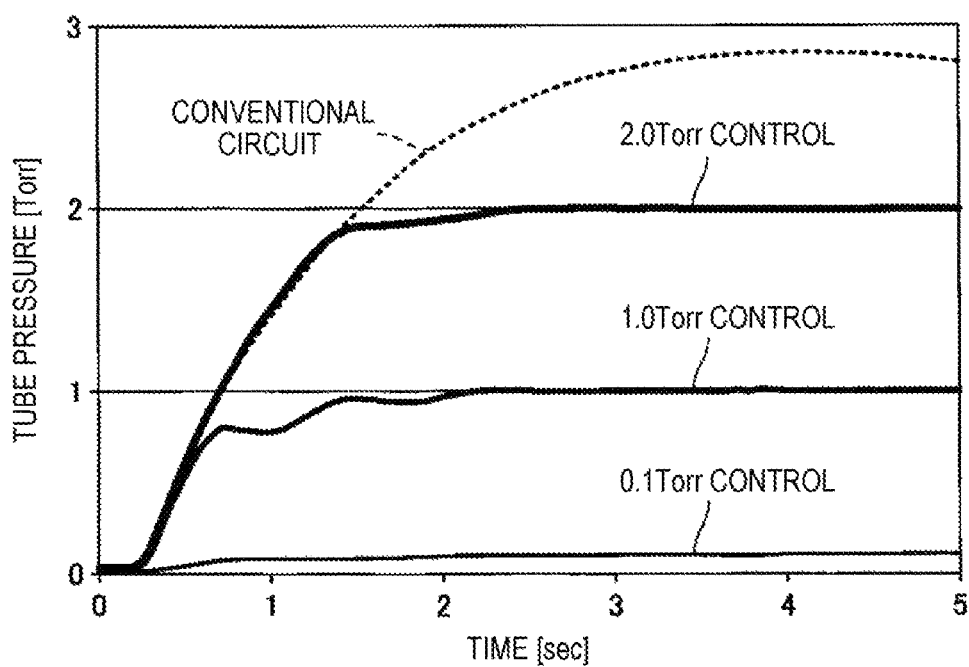

FIGS. 6A and 6B are graphs depicting the pressure controllability in relation to Example 2 of the present disclosure. In Example 2, a variation in the internal pressure of the process container 10 with time was measured by supplying a gas in a state where the internal charge pressure of the gas storage tank 40 was set to 350 Torr, and the internal target pressure of the process container 10 was set to 2.0 Torr, 1.0 Torr, and 0.1 Torr. FIG. 6A illustrates the pressure controllability for a time interval of 60 seconds, and FIG. 6B is an enlarged view illustrating the pressure controllability for a time interval of 5 seconds.

As illustrated in FIG. 6A, the substrate processing apparatus and the gas supply method in the related art exhibited a pressure characteristic in which the internal pressure of the process container 10 rapidly increased in an initial stage and then rapidly dropped. Thus, the flow rate also underwent the same variation.

Meanwhile, in the case where the internal pressure of the process container 10 was controlled to be a predetermined pressure of 2.0 Torr, the internal pressure of the process container 10 was uniformly maintained at 2.0 Torr for about 15 seconds. During the time period, the flow rate of the gas supplied from the gas storage tank 40 to the process container 10 through the gas supply pipe 20 was also made constant, as described above with reference to FIGS. 2 and 3.

Likewise, in the case where the internal pressure of the process container 10 was controlled to be a predetermined pressure of 1.0 Torr, the flow rate of the gas was uniformly maintained for 40 seconds or more. Even in the case of 0.1 Torr, needless to say, the flow rate of the gas was uniformly maintained for a further prolonged period of time.

As illustrated in FIG. 6B, the same results are also illustrated in the enlarged view illustrating the pressure controllability for a time interval of 5 seconds. That is to say, it can be seen that the substrate processing apparatus and the gas supply method in the related art fail to make the flow rate constant but constantly controls the flow rate under the condition that the pressure is controlled to be constant.

Figure 7A:
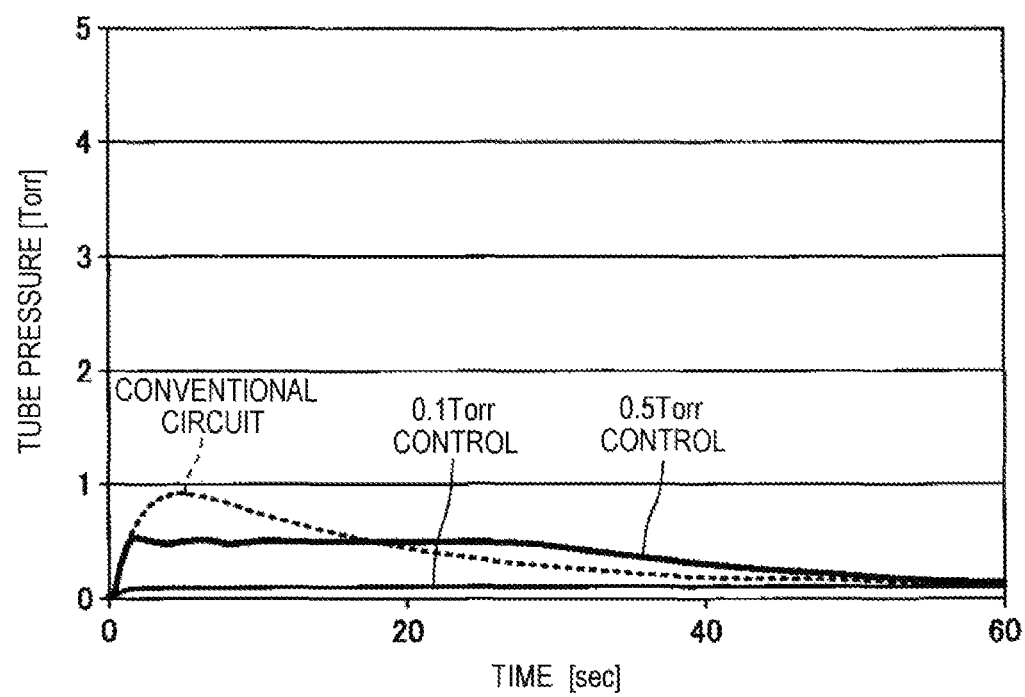
FIGS. 7A and 7B are graphs depicting a pressure controllability relating to Example 3 of the present disclosure, where
Figure 7B:
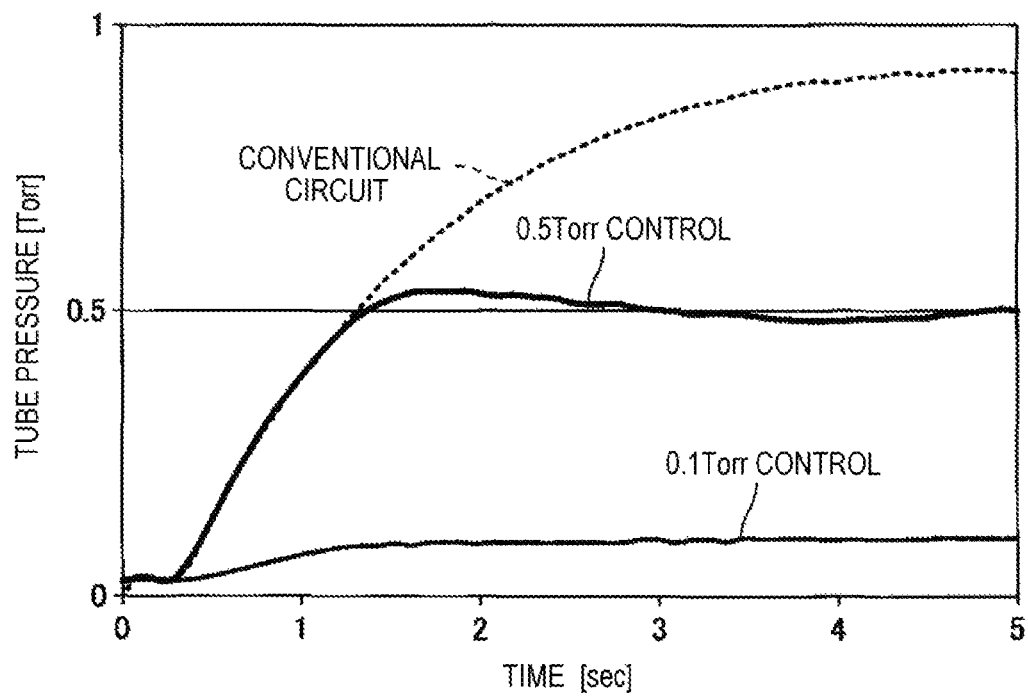

FIGS. 7A and 7B are graphs depicting the pressure controllability in relation to Example 3 of the present disclosure. In Example 3, a variation in the internal pressure of the process container 10 with time was measured by supplying a gas in a state where the internal charge pressure of the gas storage tank 40 was set to 100 Torr, and the internal target pressure of the process container 10 was set to 0.5 Torr and 0.1 Torr. FIG. 7A illustrates the pressure controllability for a time interval of 60 seconds, and FIG. 7B is an enlarged view illustrating the pressure controllability for a time interval of 5 seconds.

As illustrated in FIG. 7A, the substrate processing apparatus and the gas supply method in the related art exhibited a pressure characteristic in which the internal pressure of the process container 10 rapidly increased in an initial stage and then rapidly dropped. Thus, the flow rate also underwent the same variation.

Meanwhile, in the case where the internal pressure of the process container 10 was controlled to be a predetermined pressure of 0.5 Torr, the internal pressure of the process container 10 was uniformly maintained at 0.5 Torr for about 30 seconds. During the time period, the flow rate of the gas supplied from the gas storage tank 40 to the process container 10 through the gas supply pipe 20 was also made constant, as described above with reference to FIGS. 2 and 3.

Likewise, in the case where the internal pressure of the process container 10 was controlled to be a predetermined pressure of 0.1 Torr, the flow rate of the gas was uniformly maintained for 40 seconds or more. Even in the case of 0.1 Torr, needless to say, the flow rate of the gas was uniformly maintained for a further prolonged period of time.

As illustrated in FIG. 7B, the same results are also illustrated in the enlarged view illustrating the pressure controllability for a time interval of 5 seconds. That is to say, it can be seen that the substrate processing apparatus and the gas supply method in the related art fail to make the flow rate constant by constantly controlling the flow rate under the condition that the pressure is controlled to be constant.

As illustrated in FIGS. 5A to 7B, which show the results of Examples 1 to 3, by performing the substrate process such that a gas is completely supplied into the process container 10 at one time in a predetermined period of time during which the pressure and flow rate are made constant, it is possible to supply the gas into the process container 10 at a constant flow rate.

As described above, according to the substrate processing apparatus and the gas supply method of the embodiments of the present disclosure, by installing the control valve 30 in the gas supply pipe 20 provided between the gas storage tank 40 and the process container 10 and controlling the opening degree of the control valve 30 such that the internal pressure of the process container 10 reaches a predetermined target pressure, it is possible to supply a large amount of gas into the process container 10 at a constant flow rate in a short period of time. Accordingly, it is possible to implement a high-quality substrate processing method and film forming method.

According to the present disclosure, it is possible to supply a large amount of gas in a short period of time while keeping a flow rate constant through pressure control.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a process container configured to receive a substrate therein;
a first gas supply pipe installed in an upstream-side of the process container;
an exhaust pipe installed in a downstream-side of the process container and configured to exhaust an interior of the process container;
a pressure sensor configured to measure an internal pressure of the process container;
an exhaust-side valve installed in the exhaust pipe;
a gas storage tank connected to the process container through the first gas supply pipe;
a mass flow controller installed in an upstream-side of the gas storage tank and configured to measure an amount of gas stored in the gas storage tank; and
a control valve installed in the first gas supply pipe and configured to allow an opening degree of the control valve to be changed and to control a flow path cross section of the first gas supply pipe; and
a controller configured to perform a feedback control of the control valve when a gas is supplied from the gas storage tank to the process container,
wherein, during the feedback control, a control signal is inputted to the control valve so as to change the opening degree of the control valve based on the internal pressure of the process container which is detected by the pressure sensor and so as to change the flow path cross section through which the gas is supplied from the gas storage tank to the process container such that the internal pressure of the process container is set to a predetermined constant pressure.

2. The apparatus of claim 1, wherein the pressure sensor is installed in the exhaust pipe between the process container and the exhaust-side valve.

3. The apparatus of claim 1, further comprising:
a second gas supply pipe connected to the gas storage tank,
wherein the controller includes a total flow rate counting part, and is further configured to output a control signal to the mass flow controller to transmit a flow rate information to the total flow rate counting part such that the total flow rate counting part measures and identifies, along with the mass flow controller, the total flow rate of the gas supplied to the gas storage tank through the second gas supply pipe.

4. The apparatus of claim 1, wherein the controller is further configured to perform the feedback control of the control valve to change the opening degree such that the internal pressure of the process container reaches the predetermined constant pressure when the exhaust-side valve is fixed to have a predetermined opening degree and the amount of the gas measured by the mass flow controller reaches a predetermined amount.

5. The apparatus of claim 4, wherein, when the gas is being stored in the gas storage tank, the controller is further configured to control the control valve to remain closed.

6. The apparatus of claim 1, further comprising: a shut-off valve installed between the gas storage tank and the control valve,
wherein the controller is further configured to control the shut-off valve to remain closed when the gas is being stored in the gas storage tank.

7. The apparatus of claim 5, wherein a time period during which the gas is supplied from the gas storage tank to the process container is set to a predetermined time period during which the predetermined amount of the gas stored in the gas storage tank is supplied into the process container while maintaining the predetermined constant pressure.

8. The apparatus of claim 7, wherein the supply of the predetermined amount of the gas to the gas storage tank and the supply of the gas from the gas storage tank to the process container are repeated a plurality of times.

9. The apparatus of claim 1, wherein the controller is further configured to control the exhaust-side valve and to perform the feedback control of the control valve based on the amount of the gas measured by the mass flow controller.

10. The apparatus of claim 1, wherein the gas storage tank stores a raw material gas for film formation.

* * * * *